United States Patent
Herder et al.

(10) Patent No.: US 8,503,964 B2
(45) Date of Patent: Aug. 6, 2013

(54) MIXER DIVIDER LAYOUT

(75) Inventors: Sjoerd Martijn Herder, Wageningen (NL); Berend Hendrik Essink, Varsseveld (NL); Johannes Petrus Antonius Frambach, Nijmegen (NL)

(73) Assignee: St-Ericsson SA, Plan-les-Ouates (CH)

( * ) Notice: Subject to any disclaimer, the term of this patent is extended or adjusted under 35 U.S.C. 154(b) by 100 days.

(21) Appl. No.: 13/087,749

(22) Filed: Apr. 15, 2011

(65) Prior Publication Data
US 2012/0081169 A1    Apr. 5, 2012

Related U.S. Application Data

(60) Provisional application No. 61/388,306, filed on Sep. 30, 2010.

(51) Int. Cl.
*H04B 1/10*    (2006.01)

(52) U.S. Cl.
USPC .............................. 455/310; 455/317; 455/333

(58) Field of Classification Search
USPC ................. 455/296, 302–306, 310, 317, 333, 455/318
See application file for complete search history.

(56) References Cited

U.S. PATENT DOCUMENTS

| | | | |
|---|---|---|---|
| 6,026,287 A | 2/2000 | Puechberty et al. | |
| 6,609,239 B1 | 8/2003 | Xavier | |
| 7,043,221 B2 * | 5/2006 | Jovenin et al. | 455/302 |
| 2004/0180643 A1 | 9/2004 | Ono et al. | |
| 2007/0224964 A1 | 9/2007 | Kwon et al. | |
| 2009/0274249 A1 * | 11/2009 | Okada et al. | 375/344 |

OTHER PUBLICATIONS

Gruson, Frank, "High-Linearity Rreceivers for Mobile Communication Applications using SiGe Technology," Dissertation DR.-ING., Universitat Ulm, pp. 1-225, Jun. 10, 2010.

* cited by examiner

*Primary Examiner* — Christian Hannon
(74) *Attorney, Agent, or Firm* — Coats & Bennett, P.L.L.C.

(57) ABSTRACT

A symmetrical, balanced, down-conversion mixer is achieved by the coordinated layout of a balanced Local Oscillator (LO) divider circuit and a balanced Radio Frequency (RF) mixer circuit, such that the LO divider is in the center and the RF mixer is arrayed symmetrically around the LO divider. In particular, the LO divider is partitioned into four portions (e.g., Ip, In, Qp, Qn), which are placed in respective quadrants, defined by orthogonal reference axes through the LO divider center. The RF mixer is similarly partitioned into four corresponding portions, which are placed around the LO divider portions in each quadrant. By integrating the LO divider and RF mixer in the layout of the symmetric, balanced, down-conversion mixer, greater component matching and control of current paths are possible, improving operational quality parameters such as IRR, IP2, and LO feedthrough.

16 Claims, 5 Drawing Sheets

MIXER DIVIDER LAYOUT

This application claims priority to U.S. Provisional Patent Application No. 61/388,306, filed Sep. 30, 2010, titled, "Mixer Divider Layout," the disclosure of which is incorporated herein by reference in its entirety.

TECHNICAL FIELD

The present invention relates generally to RF receiver circuits, an in particular to a symmetrical physical IC layout for a frequency down-conversion mixer including an LO divider circuit and an RF mixer circuit.

BACKGROUND

Conventional Radio Frequency (RF) wireless communication system receivers and transceivers receive an RF wireless signal—typically in the GHz frequency range—at one or more antennas. The received signal is processed by a receiver circuit including a Low Noise Amplifier (LNA), operative to amplify the antenna signal, and a down-conversion mixer operative to convert the RF signal to a much lower frequency, usually well below 100 MHz, by mixing it with a Local Oscillator (LO) signal. The receiver circuit additionally contains circuits and software functions implementing operations such as analog to digital conversion (ADC), amplification, filtering, and demodulation. In modern receivers, most or all receiver circuits are integrated into one or more integrated circuit (IC) chips.

FIG. 1 depicts a conventional down-conversion mixer 1. The down-conversion mixer 1 includes an RF mixer circuit 3 receiving an RF signal from a LNA 2. The RF mixer 3 additionally receives a synthesized LO signal. The LO signal is generated by an LO divider circuit 4, which divides the output of a frequency source, such as a Voltage Controlled Oscillator (VCO) 5.

The RF mixer 3 and LO divider 4 are balanced circuits, as indicated by the p and n notations in FIG. 1. As known in the art, a balanced circuit is one in which the reference voltage is not ground, but rather an inverted version of the signal itself. Balanced circuits thus include complementary (or "mirrored") positive (p) and negative (n) portions. Balanced circuits improve signal quality by rejecting common-mode interference and noise, including that generated by component mismatches, temperature instability, and the like. When realized in integrated circuits, balanced circuits additionally require fewer via holes to reference a common ground voltage, and have lower parasitic inductance and capacitance. As also known in the art, RF receiver circuits divide RF signals into In-phase (I) and Quadrature (Q) components, which are offset in phase, e.g., by 90°. Both the RF mixer 3 and LO divider 4 include I and Q components operative to process the I and Q signal components. Since both the I and Q circuit components are balanced, both the RF mixer 3 and LO divider 4 generate four outputs, denoted herein (and indicated in FIG. 1) as Ip, In, Qp, and Qn.

The down-conversion mixer 1 determines some important performance parameters of the overall receiver. For example, the Image Rejection Ratio (IRR), the second order intercept point (IP2) and the LO feedthrough are strongly dependent on the balancing of the down-conversion mixer 1.

The circuits forming the RF mixer 3 and LO divider 4 include transistors and passive components. Effective balancing of the circuits is primarily determined by the matching of the devices therein. Small component mismatches can lead to large degradation of the IRR or the IP2 (or both). For example, a 2% mismatch in the components in the down-conversion mixer 1 degrades the IRR to 34 dB. If better IRR is required, calibration is conventionally performed to restore the balancing and achieve an IRR >40 dB. A similar effect is observed with respect to IP2, where target values are in excess of +50 dBm—indeed, some systems require IP2>+70 dBm.

Balance in the RF mixer 3 and LO divider 4 circuits may be influenced by physical layout of the circuits on an integrated circuit. In prior art designs, physical symmetry may be targeted on the RF mixer 3 and/or LO divider 4 block layout level, but is not considered in the combination of these two functions in the top-level layout. Furthermore, where the layout of prior art RF mixer 3 and/or LO divider 4 blocks may appear to exhibit physical symmetry (i.e., placement of components), they are not electrically symmetrical (i.e., when considering the flow of currents). In prior art layouts, RF current return loops—such as those between portions of the RF mixer 3 and LO divider 4—are relatively long, and are not electrically symmetric. Additionally, prior art RF mixer 3 and LO divider 4 circuit layouts experience high current consumption due to long interconnect lines. The increased interconnect capacitances must be charged and discharged at GHz frequency, requiring larger driver buffers, and draining more current.

Achieving acceptable balance in prior art receiver RF mixer 3 and LO divider 4 circuits is elusive, at least partially due to deficiencies in the physical layout of these circuit blocks.

SUMMARY

According to embodiments of the present invention disclosed herein, a symmetrical, balanced, down-conversion mixer is achieved by the coordinated layout of a balanced Local Oscillator (LO) divider circuit and a balanced Radio Frequency (RF) mixer circuit, such that the LO divider is in the center and the RF mixer is arrayed symmetrically around the LO divider. In particular, the LO divider is partitioned into four portions (e.g., Ip, In, Qp, Qn), which are placed in respective quadrants, defined by orthogonal reference axes through the LO divider center. The RF mixer is similarly partitioned into four corresponding portions, which are placed around the LO divider portions in each quadrant. In one embodiment, a single quadrant of the LO divider and RF mixer are laid out and saved to a library, and subsequent quadrants are formed as copies of the quadrant retrieved from the library. By integrating the LO divider and RF mixer in the layout of the symmetric, balanced, down-conversion mixer, greater component matching and control of current paths are possible, improving operational quality parameters such as IRR, IP2, and LO feedthrough.

One embodiment relates to a method of laying out, on an IC, a symmetric, balanced, down-conversion mixer comprising a balanced LO divider circuit and a balanced RF mixer circuit. Each of the LO divider and RF mixer are divided into four corresponding portions. The LO divider is laid out such that each of the four portions occupies a quadrant arranged around the LO divider center, the quadrants defined by two orthogonal reference axes. Each of the RF mixer portions is laid out in the same quadrant as a corresponding LO divider portion, such that the RF mixer is laid out around the LO divider symmetrically along both axes.

Another embodiment relates to receiver IC. The IC includes a symmetric, balanced, down-conversion mixer comprising a balanced LO divider circuit and a balanced RF mixer circuit, each comprising four corresponding portions. The LO divider is arranged such that each of the four portions occupies a quadrant arranged around the LO divider center, the quadrants defined by two orthogonal reference axes. Each of the RF mixer portions is arranged in the same quadrant as a corresponding LO divider portion, such that the RF mixer is laid out around the LO divider symmetrically along both axes.

DETAILED DESCRIPTION

As described above, a balanced RF mixer generating In-phase (I) and Quadrature (Q) signal components outputs four signals: Ip, In, Qp, and Qn. The I and Q signal component processing is the same, the I and Q components being defined by a phase offset (e.g., 90°). Also, both sides of a balanced RF mixer comprise a mirror image in components and routing. Hence, a balanced RF mixer with I and Q components may be divided into four portions—those generating the Ip, In, Qp, and Qn output signals—each of which comprise the same or mirror-image components and have corresponding signal routing metallization, and hence are generally the same size when laid out on an IC.

An LO divider typically divides the periodic output of a Voltage Controlled Oscillator (VCO) by some factor (e.g., two) and outputs two versions of the divided frequency signal, offset in phase, e.g., by 90°. The positive and negative components of a balanced LO signal having 0° phase offset correspond to, and primarily interact with, the Ip and In portions the RF mixer, respectively. Similarly, the positive and negative components of a balanced LO signal having a 90° phase offset correspond to, and primarily interact with, the Qp and Qn portions the RF mixer, respectively. Similar to the RF mixer, the LO divider, generating four LO output signals, may be divided into four portions, each of which comprise the same or mirror-image components and have corresponding signal routing metallization, and hence are generally the same size when laid out on an IC. Due to the correspondence between the four LO outputs and the four portions of the RF mixer, many signal interactions, and hence current loops, between the LO divider and RF mixer are highly localized between the corresponding segments, or portions, of the two circuits.

Figure 1:
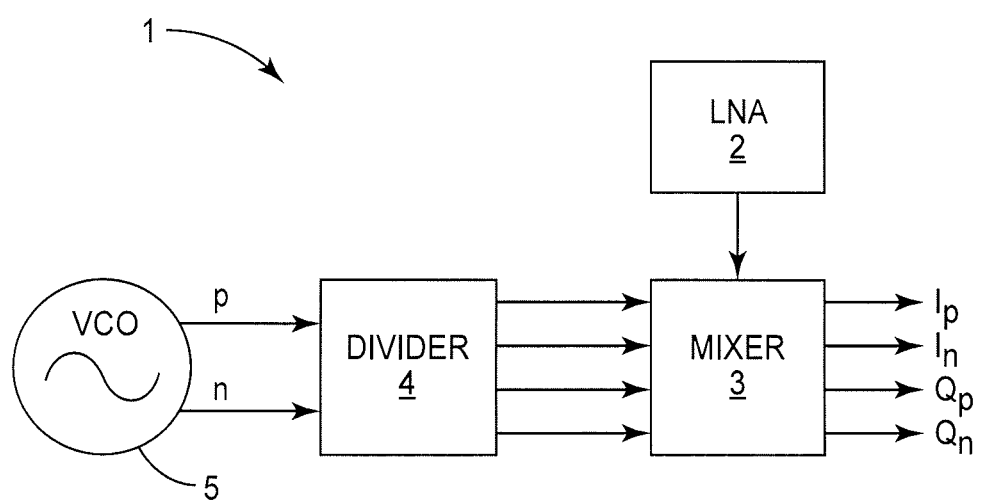
FIG. 1 is a functional block diagram of an RF mixer and LO clock divider down-converting a received RF communication signal, according to the prior art.
Figure 2:
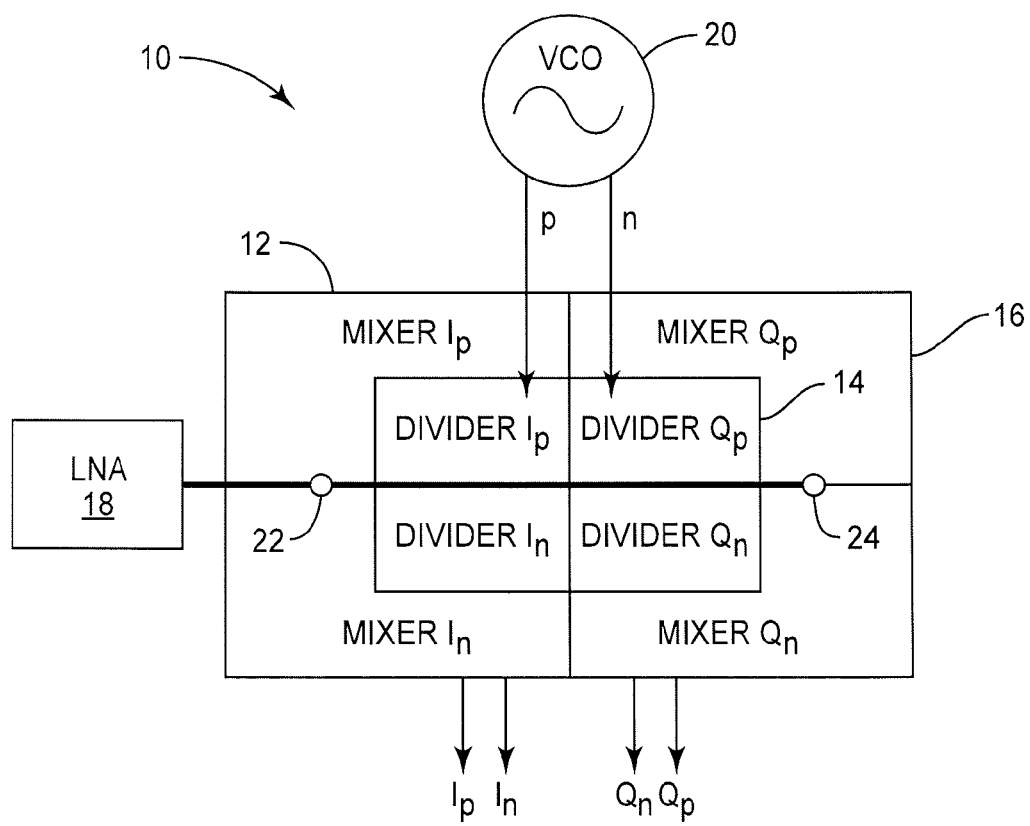
FIG. 2 is a schematic block diagram depicting a layout strategy for a symmetric, balanced down-conversion mixer comprising an LO divider and RF mixer.

FIG. 2 depicts a functional schematic block diagram of the physical IC layout of a portion of a receiver circuit 10, including a symmetric, balanced, down-conversion mixer 12 according to one embodiment. The symmetric, balanced, down-conversion mixer 12 comprises a balanced LO divider 14 receiving the positive and negative outputs of a VCO 20. The LO divider 14 is laid out symmetrically about a reference system comprising two orthogonal axes (e.g., a Cartesian reference system, as depicted in FIG. 2). The axes define four quadrants. Each of the four portions of the LO divider 14—that is, the positive and negative components of circuits generating LO signals with 0° and 90° relative phase offsets, each of which primarily interacts with one of the portions of a balanced, IQ RF mixer 16—is laid out in a separate quadrant, arrayed around the center of the LO divider circuit 14 (which corresponds to the intersection of the orthogonal axes).

As further depicted in FIG. 2, a balanced IQ RF mixer 16 receives an RF signal for down-conversion from an LNA 18. The four portions of the balanced IQ RF mixer 16 are laid out around the LO oscillator 14, with each RF mixer 16 portion in the same quadrant as the portion of the LO oscillator supplying the corresponding balanced, phase-offset LO signal, as indicated in FIG. 2 by the Ip, In, Qp, and Qn notations on both the LO divider 14 and RF mixer 16 circuit portions. In this embodiment, each RF mixer 16 portion "embeds" a corresponding LO divider 14 portion. In this layout, the LO signals driving the RF mixer 16 switches arrive in a mirror-symmetrical fashion from the center, towards the RF mixer 16 at the perimeter. This not only minimizes the RF current path lengths, but more importantly, it preserves balance by ensuring that corresponding current paths in the different portions have the same length.

Figure 4:
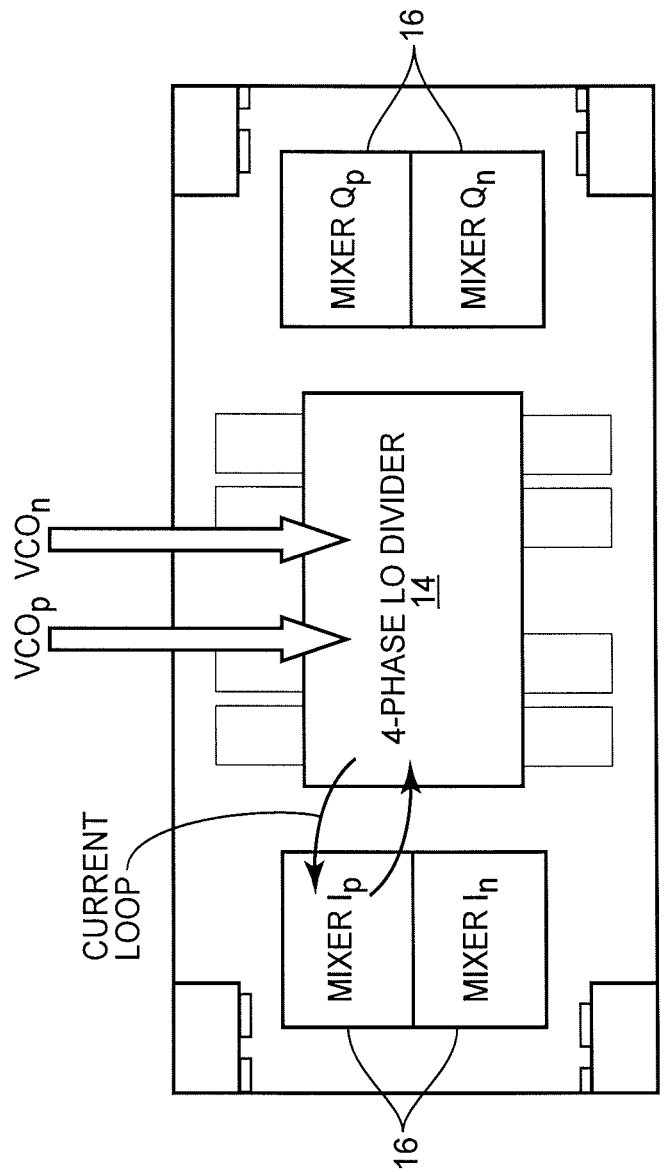
FIG. 4 is a schematic block diagram of the layout of FIG. 3, with a representative RF current loop depicted.

Furthermore, the inventive layout confines all RF current loops between each respective portion of the LO divider 14 and corresponding portion of the RF mixer 16 to a highly localized area of the chip. FIG. 4 depicts an example of a current loop between the Ip portion of the RF mixer 16 and the corresponding portion of the LO divider 14. Of course, similar current loops are confined to corresponding circuits in all four quadrants. These a local current loops can be fully mastered by a layout engineer, ensuring a very high degree of symmetry. In practice, some or all of the return path may be via a ground plane or network. Extracted layout simulations of the combined block have confirmed a high degree of balance between current loops, in the design verification stage.

Layouts according to embodiments of the present invention achieve a high degree of symmetry as compared to the prior art, as each RF mixer 16 quadrant embeds, or is otherwise physically close to, a corresponding LO divider 14 quadrant. In a traditional layout, in contrast, an LO divider is positioned at one side of an RF mixer, and the four LO signal wires arrive from one side, making the layout asymmetrical. Although small, these asymmetries result in a reduced IRR and lower IP2, as compared to layouts according to embodiments of the present invention, as verified by extracted layout simulation. This is due primarily to the parasitic wiring capacitances, which have slightly different values for the four LO wires, but also to the overlap capacitances of the four wires going towards a common part in the layout, rather than four symmetrical parts, as in the inventive layout.

Figure 3:
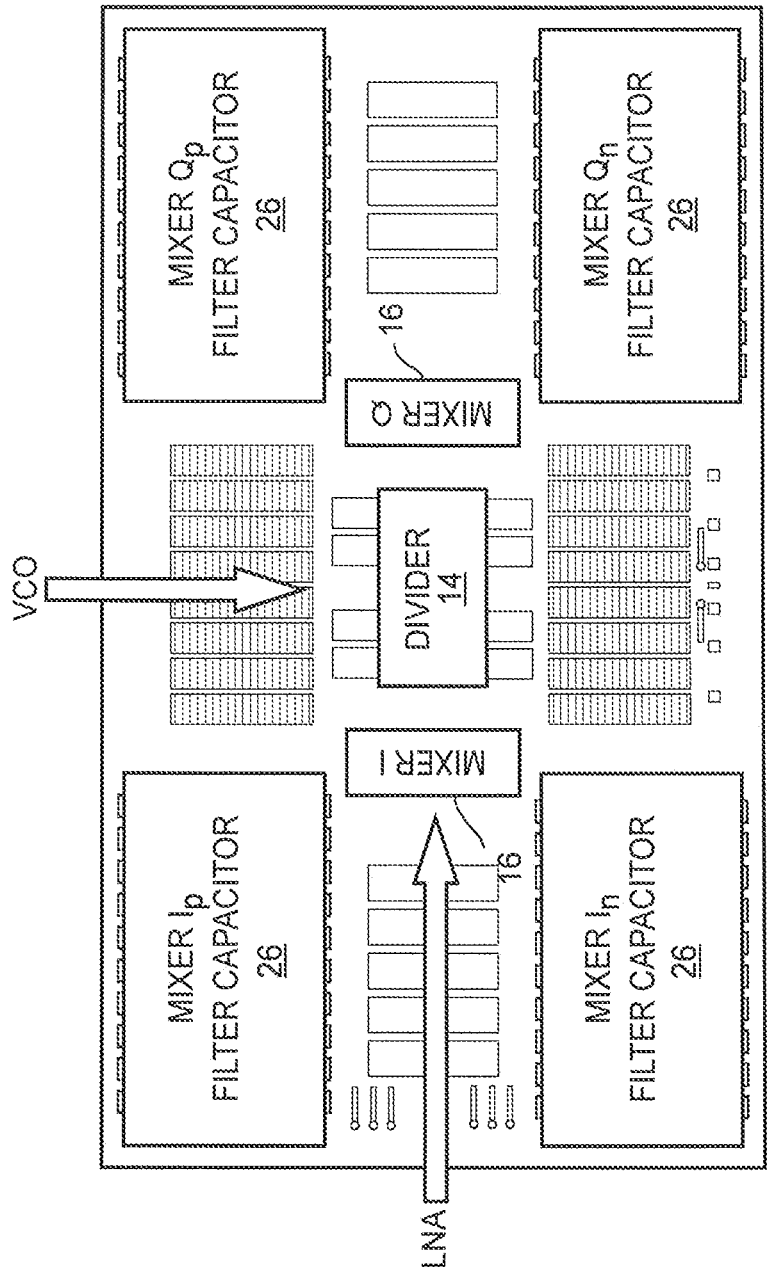
FIG. 3 is a schematic depicting a physical integrated circuit layout of the symmetric, balanced down-conversion mixer of FIG. 2.

FIG. 3 depicts a view of a physical layout on an IC, according to one embodiment of the present invention. As this figure depicts, the LO divider 14 is in the center (core). In particular, its center is positioned at the intersection of two orthogonal reference axes. The four RF mixer 16 quadrants are placed symmetrically around this core. The IF filter capacitances are positioned as a ring around the mixer-divider structure. Outputs from the LNA 18 (the received signal to be down-converted) and from the VCO 20 (the reference frequency to be divided and phase-shifted) are connected along the axes of symmetry.

In particular, referring back to FIG. 2, the output from the LNA is connected over the left, or I, side of the RF mixer 16 and via 22, and extends across the LO divider 14 to reach the right, or Q, side of the RF mixer 16 at via 24. The metal track carrying the LNA output is extended across the symmetric, balanced, down-conversion mixer 12, to the right edge thereof, to preserve symmetry.

In addition to good symmetry, and short, local RF current return loops between gates in corresponding quadrants of the LO divider 14 and RF mixer 16, the inventive layout also achieves a uniform oxide definition (OD) layer, yielding consistent Shallow Trench Isolation (STI) stress. In one embodiment, hand crafting a layout overlay for one quadrant, storing the layout in a library, and then placing it four times—rather than use of a silicon foundry tiling script—results in more uniform metal tiling. The inventive layout further results in good device matching due to very uniform environment (e.g., equal metal and STI stress for all devices). The RF components are also placed in close proximity, an advantage for achieving balance as effective component mismatches increase with distance.

The layout depicted in FIGS. 3 and 4 is implemented, in one embodiment, in 45 nm CMOS process technology. However, the invention is not limited to this process technology, or to CMOS processes. Given the teachings herein, those of skill in the art may readily apply the inventive layout strategy and techniques to BiCMOS, GaAs, and other integrated circuit technologies, as appropriate for particular implementations of RF receivers.

FIGS. 2, 3, and 4 depict the inventive layout having the I component of the LO divider 14 and RF mixer 16 on the left side (as viewed in the figures) and the Q component on the right. Further, FIGS. 2 and 4 depict the n side of the balanced LO divider 14 and RF mixer 16 in the lower quadrants, and the p side in the upper quadrants. This orientation is representative only, and is not a limitation of the inventive layout of a symmetric, balanced, down-conversion mixer 12. Rather, any of the four circuit portions—that is, Ip, In, Qp, and Qn—may be placed in any of the four quadrants formed by two orthogonal reference axes crossing at the center of the LO divider 14, so long as a given circuit portion of the LO divider 14 is in the same quadrant as the corresponding portion of the RF mixer 16. Of course, placing the p and n sides of the balanced circuits adjacent each other will improve routing by avoiding excessive wiring congestion through the center. That is, e.g., Ip and In are preferably placed in adjacent quadrants and not diametrically opposed ones; however, these placements are preferred embodiments and not limitations of the invention. Similarly, the relative placement of the LNA 18 and VCO 20, as depicted in FIGS. 2, 3, and 4, are representative only and are not limitations of the present invention.

Figure 5:
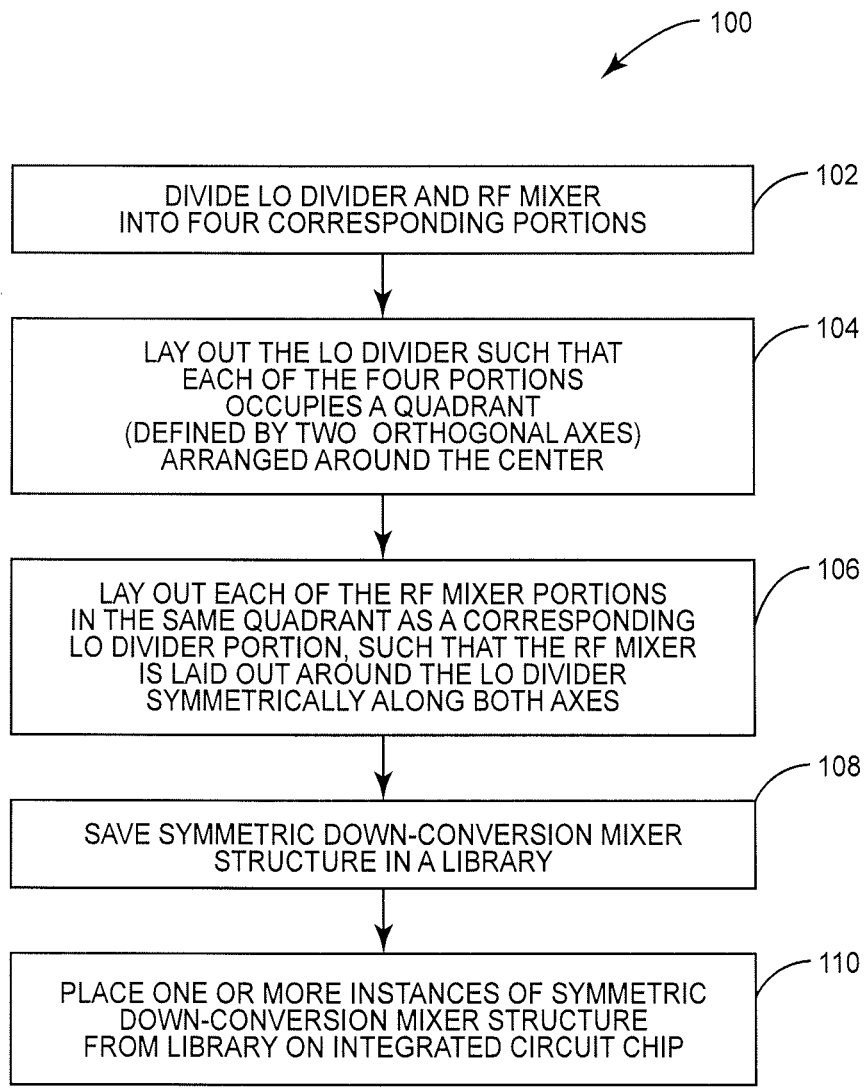
FIG. 5 is a flow diagram of a method of laying out a symmetric, balanced down-conversion mixer comprising balanced LO divider and RF mixer circuits.

FIG. 5 depicts the steps in a method 100 of laying out a symmetric, balanced, down-conversion mixer 12, comprising a balanced LO divider 14 circuit and a balanced RF mixer 16 circuit, on an IC. Both the LO divider 14 and RF mixer 16 are divided into four portions, each portion of the LO divider 14 corresponding to a portion of the RF mixer 16 (e.g., Ip, In, Qp, and Qn) (block 102). The LO divider 14 is laid out such that each of the four portions occupies a quadrant, defined by two orthogonal reference axes, arranged around the center (block 104). Each of the RF mixer 16 portions is then laid out in the same quadrant as a corresponding LO divider 14 portion, such that the RF mixer 16 is laid out around the LO divider 14 symmetrically along both reference axes (block 106). In one embodiment, this may comprise laying out one quadrant (i.e., one each of corresponding LO divider 14 and RF mixer 16 portions), saving the layout in a library, and then replicating the quadrant, changing the orientation as required, to achieve the symmetry. The laid-out symmetric, balanced, down-conversion mixer 12 structure may then be saved in a library (block 108), and one or more instances placed on an IC chip (block 110).

Combining the LO divider 14 and RF mixer 16 in one integrated block for layout, according to embodiments of the present invention, presents numerous advantages over prior art divider/mixer layouts. The inventive layout allows the circuits to achieve a very high degree of symmetry, resulting in very good IRR and IP2 metrics. In fact, for some communication systems, the un-calibrated IRR and IP2 resulting from the inventive layout are sufficient to meet system requirements, saving an expensive calibration step. For example, if the IRR target is around 40 dB and the IP2 target around +50 dBm, no calibration may be required.

Additionally, the highly symmetrical quality of the inventive layout helps to reduce the LO feedthrough and the self-mixing effect in "zero-IF" and "near zero-IF" receiver architectures (also known as "direct conversion" receivers). Since all sources of LO cross-talk to the LNA input are placed symmetrically, they will cancel to a large extent. This alleviates the undesirable self-mixing for these receiver architectures.

Furthermore, considering the LO divider 14 and RF mixer 16 together in one layout also ensures correct layout extraction for design verification simulations. All interconnect is included, so designers cannot forget some crucial parasitic capacitances in the sign-off simulations.

The present invention may, of course, be carried out in other ways than those specifically set forth herein without departing from essential characteristics of the invention. The present embodiments are to be considered in all respects as illustrative and not restrictive.

What is claimed is:

1. A method of laying out, on an integrated circuit (IC), a symmetric, balanced, down-conversion mixer comprising a balanced Local Oscillator (LO) divider circuit and a balanced Radio Frequency (RF) mixer circuit, comprising:
    dividing each of the LO divider and RF mixer into four corresponding portions;
    laying out the LO divider such that each of the four portions occupies a quadrant arranged around the LO divider center, the quadrants defined by two orthogonal reference axes; and
    laying out each of the RF mixer portions in the same quadrant as a corresponding LO divider portion, such that the RF mixer is laid out around the LO divider symmetrically along both axes.

2. The method of claim 1 wherein the balanced LO divider and RF mixer circuits each comprise in-phase (I) and quadrature (Q) components, and wherein the four portions comprise the positive and negative portions of balanced circuits for each of the I and Q components.

3. The method of claim 1 wherein current loops between each corresponding portion of the LO divider and RF mixer are confined to the respective quadrant.

4. The method of claim 1 wherein path lengths between components in each portion of the LO divider and RF mixer are substantially equal to path lengths between corresponding components in the other portions of the LO divider and RF mixer.

5. The method of claim 1 further comprising laying out Intermediate Frequency (IF) filter capacitances around the symmetric, balanced, down-conversion mixer structure.

6. The method of claim 1 wherein an RF signal is supplied to the symmetric, balanced, down-conversion mixer structure from one side, substantially along one of the reference axes, via a metal track that extends substantially to the opposite side of the symmetric, balanced, down-conversion mixer structure.

7. The method of claim 6, wherein a LO signal is supplied to the symmetric, balanced, down-conversion mixer structure from one side, substantially along a reference axis orthogonal to the reference axis along which the RF signal is supplied.

8. The method of claim 1 wherein laying out the LO divider and RF mixer portions comprises:
   laying out one LO divider portion and a corresponding RF mixer portion;
   saving the integrated divider/mixer portion layout in a library; and
   laying out the remaining portions of the symmetric, balanced, down-conversion mixer structure by copying the integrated divider/mixer portion from the library.

9. The method of claim 1, further comprising
   saving the laid-out, symmetric, balanced, down-conversion mixer structure in a library; and
   placing one or more instances of the symmetric, balanced, down-conversion mixer structure on an IC.

10. A receiver integrated circuit (IC) comprising:
   a symmetric, balanced, down-conversion mixer comprising a balanced Local Oscillator (LO) divider circuit and a balanced Radio Frequency (RF) mixer circuit, each comprising four corresponding portions, wherein
   the LO divider is arranged such that each of the four portions occupies a quadrant arranged around the LO divider center, the quadrants defined by two orthogonal reference axes; and
   Each of the RF mixer portions is arranged in the same quadrant as a corresponding LO divider portion, such that the RF mixer is laid out around the LO divider symmetrically along both axes.

11. The IC of claim 10 wherein the balanced LO divider and RF mixer circuits each comprise in-phase (I) and quadrature (Q) components, and wherein the four portions comprise the positive and negative portions of balanced circuits for each of the I and Q components.

12. The IC of claim 10 wherein current loops between each corresponding portion of the LO divider and RF mixer are confined to the respective quadrant.

13. The IC of claim 10 wherein path lengths between components in each portion of the LO divider and RF mixer are substantially equal to path lengths between corresponding components in the other portions of the LO divider and RF mixer.

14. The IC of claim 10 further comprising Intermediate Frequency (IF) filter capacitances arranged symmetrically around the symmetric, balanced, down-conversion mixer structure.

15. The IC of claim 10 wherein the symmetric, balanced, down-conversion mixer further includes a metal track supplying an RF signal from one side, the metal track running substantially along one of the reference axes and extending substantially to the opposite side of the symmetric, balanced, down-conversion mixer structure.

16. The IC of claim 15, wherein the symmetric, balanced, down-conversion mixer further includes a metal track supplying a LO signal from one side, substantially along a reference axis orthogonal to the reference axis along which the RF signal metal track runs.

* * * * *